US009945966B2

(12) United States Patent
Eichenseer et al.

(10) Patent No.: US 9,945,966 B2
(45) Date of Patent: Apr. 17, 2018

(54) PRODUCTION METHOD OF A SENSOR CHIP AND COMPUTERIZED TOMOGRAPHY DETECTOR

(71) Applicant: Siemens Aktiengesellschaft, München (DE)

(72) Inventors: Mario Eichenseer, Hirschaid (DE); Thomas Reichel, Heroldsbach (DE); Stefan Wirth, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 212 days.

(21) Appl. No.: 14/779,377

(22) PCT Filed: Mar. 19, 2014

(86) PCT No.: PCT/EP2014/055488
§ 371 (c)(1),
(2) Date: Sep. 23, 2015

(87) PCT Pub. No.: WO2014/166712
PCT Pub. Date: Oct. 16, 2014

(65) Prior Publication Data
US 2016/0054457 A1    Feb. 25, 2016

(30) Foreign Application Priority Data
Apr. 11, 2013 (DE) .................. 10 2013 206 404

(51) Int. Cl.
*G01T 1/29* (2006.01)
*H01L 27/146* (2006.01)
(52) U.S. Cl.
CPC ...... *G01T 1/2985* (2013.01); *H01L 27/14636* (2013.01); *H01L 27/14643* (2013.01); *H01L 27/14658* (2013.01); *H01L 27/14689* (2013.01)

(58) Field of Classification Search
CPC .................................................. G01T 1/2985
See application file for complete search history.

(56) References Cited

U.S. PATENT DOCUMENTS 5,254,868 A   10/1993   Saito
5,812,191 A   9/1998    Orava et al.
6,035,013 A   3/2000    Orava et al.
(Continued)

FOREIGN PATENT DOCUMENTS

CN    1132408 C    12/2003
CN    1901198 A    1/2007
(Continued)

OTHER PUBLICATIONS

Shin M.-S. et al; "CMOS X-Ray Detector With Column-Parallel 14.3-bit Extended-Counting ADCs"; IEEE Transations on Electron Devices; vol. 60; No. 3; pp. 1169-1177; DOI: 10.1109/TEDEC.2013.2238674; 2013.
(Continued)

*Primary Examiner* — David Porta
*Assistant Examiner* — Hugh H Maupin
(74) *Attorney, Agent, or Firm* — Harness, Dickey & Pierce, P.L.C.

(57) ABSTRACT

A sensor chip, in particular for computerized tomography detectors, including an analog-digital converter electrically connected to an element detecting radiation. A problem addressed is that of defining a sensor chip which is as cost-efficient and reliable as possible. According to an embodiment of the invention, only one single crystalline base plate is used, on which all required components of the sensor chip are applied. A through-contact between the conductor paths or the contacts of both sides of the base plate is used as applicable in order to connect the components of both sides to each other.

20 Claims, 3 Drawing Sheets

(56) References Cited

U.S. PATENT DOCUMENTS

| | | | |
|---|---|---|---|
| 2001/0001562 A1 | 5/2001 | Orava et al. | |
| 2001/0002844 A1 | 6/2001 | Orava et al. | |
| 2002/0089595 A1 | 7/2002 | Orava et al. | |
| 2002/0148957 A1* | 10/2002 | Lingren | G01T 1/161 250/252.1 |
| 2003/0164888 A1 | 9/2003 | Orava et al. | |
| 2005/0121617 A1 | 6/2005 | Heismann et al. | |
| 2007/0004121 A1 | 1/2007 | Eckstein et al. | |
| 2007/0131988 A1* | 6/2007 | Lin | H01L 27/14603 257/291 |
| 2008/0099870 A1 | 5/2008 | Wilson et al. | |
| 2009/0224352 A1 | 9/2009 | Wilson et al. | |
| 2011/0226951 A1 | 9/2011 | Kammerer et al. | |

FOREIGN PATENT DOCUMENTS

| | | |
|---|---|---|
| DE | 10357202 A1 | 6/2005 |
| DE | 102005029784 A1 | 1/2007 |
| DE | 102007022197 A1 | 4/2008 |
| DE | 102010011582 B4 | 12/2011 |
| JP | 2006129298 A | 5/2006 |
| WO | WO 03083944 A1 | 10/2003 |

OTHER PUBLICATIONS

German Office Action dated Sep. 12, 2013.
International Search Report and Written Opinion dated Jul. 4, 2014.
International Search Report PCT/ISA/210 for International Application No. PCT/EP2014/055488 dated Jun. 26, 2014.
Written Opinion of the International Searching Authority PCT/ISA/237 for International Application No. PCT/EP2014/055488 dated Jun. 26, 2014.
Chinese Office Action and English translation thereof dated Apr. 20, 2017.

* cited by examiner

PRODUCTION METHOD OF A SENSOR CHIP AND COMPUTERIZED TOMOGRAPHY DETECTOR

PRIORITY STATEMENT

This application is the national phase under 35 U.S.C. § 371 of PCT International Application No. PCT/EP2014/055488 which has an International filing date of Mar. 19, 2014, which designated the United States of America and which claims priority to German patent application number DE 102013206404.7 filed Apr. 11, 2013, the entire contents of which are hereby incorporated herein by reference.

FIELD

At least one embodiment of the invention generally relates to a sensor chip, in particular for computerized tomography detectors, having an analog-digital-converter electrically connected to an element detecting radiation. Furthermore, at least one embodiment of the invention generally relates to a computerized tomography detector, a production method of such a sensor chip, and/or a method for operating a sensor chip.

A sensor chip is generally understood to mean a sensor circuit, the electrical and electronic components of which were applied on semiconductor substrates or integrated therein. The semiconductor substrate is generally designated as a wafer or base plate which as a whole is produced with a multiplicity of sensor circuits in order to then separate these from each other and wire them after the production process.

BACKGROUND

Such sensor chips are used in computerized tomography detectors (CT detectors) which are used for medical imaging. A computer tomograph permits better diagnosis if a high resolution, i.e. a high number of pixels per surface, is ensured. One sensor chip usually corresponds to one pixel, whereby to achieve the desired resolution as a rule a multiplicity of sensor chips is required. Lithographic integration in semiconductor substrates is already advantageous for cost reduction on account of this multiplicity of pixels required.

In addition, the sensor chips must be suitable for arranging in a defined two-dimensional manner with additional sensor chips in order to precisely define the pixel spacing. Each dimension requires the flat arrangement of two adjacent sensor chips. Consequently, it must be possible to arrange a total of four sensor chips laterally. Especially for this quadrilateral arrangement requirement, as is conventional for large-area CT detectors, sensors based on semiconductor substrates are also highly suitable.

For example, DE 10 2007 022 197 A1 discloses a detector element for an X-ray detector for use in an X-ray computer tomograph. This detector element has a number of components based on semiconductor substrates, namely a detection element, a module with electronic circuits and a contact element which is arranged between the two aforementioned and has two functions, namely on the one hand to ensure mechanical stabilization of the sensor element and on the other hand to adapt the geometric arrangement of the signal output contacts of the detection element to the geometric arrangement of the signal input contacts of the module by way of its conductor paths.

A detector module for a radiation detector is known from DE 10 2010 011 582 B4 which has the function of an optoelectrical converter layer with downstream rewiring on the associated substrate, whereby on account of the novel arrangement of the signal output contacts the cable-based connection of the external readout electronics is easier.

The production and material costs are very high with the current solutions, particularly as a so-called wafer-bonding method often has to be employed or the contact costs are simply very high.

SUMMARY

At least one embodiment of the invention improves the production process and/or reduces the material costs for sensor chips of the aforementioned nature and positive properties, such as quality or service life.

Embodiments of the invention are directed to a sensor chip, a computerized tomography detector, a production method of a sensor chip and a method for operating a sensor.

According to at least one embodiment of the invention a sensor chip, in particular for computerized tomography detectors, has an analog-digital-converter electrically connected to an element detecting radiation and a crystalline base plate, wherein components of the element detecting radiation and components of the analog-digital converter are lithographically integrated on one detector side of the crystalline base plate. This is extremely advantageous because two crystalline base plates need not pass through the lithographic integration process of the necessary circuits in order to then be linked to each other in a bonding method in a likewise expensive manner. Furthermore, the sensor chip according to at least one embodiment of the invention ensures very robust electronic circuitry which, especially in the case of a multiplicity of sensor chips in CT detectors, helps the latter to achieve more stable operation and a longer service life. In addition, a likewise advantageous optimization of the installation space is obtained.

An embodiment of the invention is directed to a production method of a sensor chip including at least:

a first step where components of an element detecting radiation and components of an analog-digital converter are lithographically integrated on a detector side of a crystalline base plate, a second step where the detector side is insulated with the components of the element detecting radiation and the components of the analog-digital converter, a third step where a through-contact for the electrically conductive connection of conductor paths of the detector side is embodied with conductor paths of the second side of the crystalline base plate, and a fourth step where the second side of the crystalline base plate is insulated.

An embodiment of the invention likewise comprises a method for the operation of a sensor chip in which radiation is detected on one detector side of a crystalline base plate of the sensor chip and the detected radiation is converted into an analog signal and the analog signal by way of an analog-digital converter into a digital signal.

Further advantageous embodiments and preferred developments of the invention can be found in the description of the figures and/or the subclaims.

BRIEF DESCRIPTION OF THE DRAWINGS

The invention is explained in more detail hereinafter with reference to the example embodiments shown in the figures.

The figures show.

DETAILED DESCRIPTION OF EXAMPLE EMBODIMENTS

Figure 1:
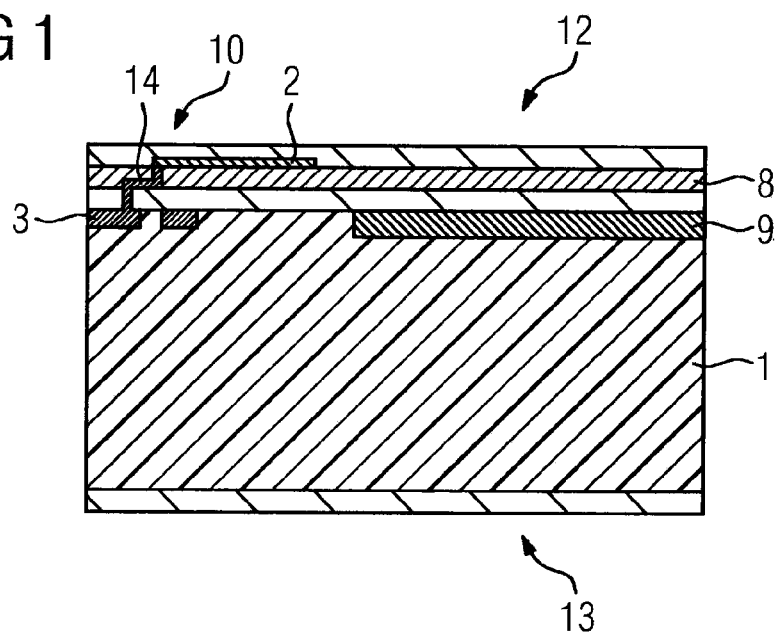
FIG. 1—a sectional view of a first sensor chip in a production section before the through-contact, FIG. 2—a sectional view of the first sensor chip from FIG. 1 after a through-contact to a conductor path of the detector side, FIG. 3—a sectional view of the first sensor chip from FIG. 2 after the application of a connection element embodied as a solder ball, FIG. 4—a sectional view of a second sensor chip with a radiation-permeable base plate, in which all the components are arranged on the detector side, and FIG. 5—a sectional view of the second sensor chip from FIG. 4 after insulation of the detector side and application of the solder balls.

According to at least one embodiment of the invention a sensor chip, in particular for computerized tomography detectors, has an analog-digital-converter electrically connected to an element detecting radiation and a crystalline base plate, wherein components of the element detecting radiation and components of the analog-digital converter are lithographically integrated on one detector side of the crystalline base plate. This is extremely advantageous because two crystalline base plates need not pass through the lithographic integration process of the necessary circuits in order to then be linked to each other in a bonding method in a likewise expensive manner. Furthermore, the sensor chip according to at least one embodiment of the invention ensures very robust electronic circuitry which, especially in the case of a multiplicity of sensor chips in CT detectors, helps the latter to achieve more stable operation and a longer service life. In addition, a likewise advantageous optimization of the installation space is obtained.

The element detecting radiation may be a photodiode or a photodiode array, the various doped transitions of which are realized by way of layer-by-layer semiconductor layer deposition based on lithographic masks. In the process, the element detecting radiation can detect the analysis radiation, in other words, in the case of a tomograph, that radiation which has also been transmitted via the body of a living being and consequently carries medical information. The element detecting radiation converts this analysis radiation into an analog electrical signal so that the medical information contained therein can be passed on electrically.

Alternatively, indirect detection can be realized by the element detecting radiation, for example, scintillation light from a scintillation element converts the analysis radiation from the body into different radiation, for example, visible light. The scintillation light is detected in the element detecting radiation of the sensor chip and there converted into an analog, electrical signal. The intermediate step is therefore necessary because semiconductor detectors, as typically used in the sensor chip, are only sensitive in a particular wavelength range of electromagnetic radiation. If the wavelength of the radiation source of the medical device, for example, an X-ray tomograph, lies outside this range indirect detection must be pursued.

The analog-digital converter is designed to convert the analog electrical output signal of the element detecting radiation into a digital signal. This circuit of the analog-digital converter is lithographically applied on the crystalline base plate and uses a multiplicity of different semiconductor layers, conductor paths and/or other components of integrated circuits.

The crystalline base plate can be a monocrystalline base plate, in other words, a section of a so-called wafer. Alternatively, depending on the embodiment of the invention, a polycrystalline base plate can also be used. Typical materials of such a base plate are silicon, silicon carbide, gallium arsenide or indium phosphide, each in monocrystalline or polycrystalline state. If the radiation to be detected is transmitted through the base plate, the spectral transmission properties of the respective material must also be considered in order to avoid unnecessary absorptions.

Lithographic integration is understood to mean the application of an application-specific, integrated circuit on the crystalline base plate. For this reason, the sensor chip may also be a so-called application-specific integrated circuit (ASIC) which is realized as a standardized integrated, electronic circuit. The function of an ASIC cannot be subsequently manipulated but the production costs are significantly lower compared to non-standardized integrated circuits.

A particular advantage of at least one embodiment of the invention is the fact that the components of the element detecting radiation and the analog-digital converter are both lithographically integrated on the first side of the crystalline base plate, namely the detector side. Thus, the costly integration process must only be performed once on the base plate and all the electrical and electronic components can be produced simultaneously and spatially in parallel and not, as hitherto, consecutively.

Advantageously, the analog-digital converter is electrically connected to an electrical connecting element on a second side opposite the detector side of the crystalline base plate via a through-contact of the crystalline base plate. Such a through-contact between conductor paths on the opposing sides of the base plate can be achieved by way of an etching process which chemically removes the base plate at an uncovered site vertically with regard to the surfaces of both sides until after some 100 micrometers a conductor path or a contact especially provided for this purpose is exposed. Insulation is followed by metal plating which creates an electrically conductive connection of the conductor paths of both sides as it settles both on the exposed contact or the exposed conductor path, as well as on the internal lateral surfaces of the recess produced by etching, as well as on a conductor path or a contact of that side of the base plate from which etching was started. Thus, the former redistribution contacts can be reduced to a minimum of material and occupied space.

In an advantageous embodiment, the through-contact has metal plating which is provided for the transmission of a digital signal from the detector side, through the crystalline base plate to the second side of the crystalline base plate. The digital signal is signal converted by the analog-digital converter which is passed on to an analysis unit which can store, display and/or otherwise process this signal. The design of a through-contact for digital signals is not as critical as, by comparison, for analog signals. The reason for this is that the digital signal operates with detection thresholds for the values 0 and 1, whereas any variation in voltage or current with an analog signal directly affects the information content of the signal. For this reason, with a through-contact less attention need be paid to leakage currents or unwanted capacities in the case of digital signals.

The through-contact is at least partially formed by a recess, in particular an etched recess, in the crystalline base plate. However, this through-contact may have further features. For example, the recess may be filled with a dielectric again or alternative or additional mechanical methods may have been used to produce the recess such as, for example, a bore.

An electrical connecting element can be applied on both the detector side and on the side of the crystalline base plate opposite the detector side. It serves to produce as safe and simple a contact as possible with an analysis unit such as, for example, a computer. The connecting element may be a solder ball, a printed circuit board contact, a socket or a plug, which are integrated into the base plate respectively or can be electroconductively connected hereto.

In an advantageous embodiment, the crystalline base plate is permeable for the radiation detectable by the element detecting radiation and the electrical connecting element is likewise applied on the detector side of the crystalline base plate. In order to further minimize the radiation losses in the base plate, these may be thinned in order to reduce the thickness of the base plate. No through-contacts are necessary for this embodiment, particularly as all the components (analog-digital converter, element detecting radiation, connecting element) are arranged on the detector side of the base plate and only the radiation to be detected is transmitted through the base plate. This is therefore a particularly cost-efficient embodiment.

The detector side is generally understood to be the side on which the element detecting radiation is embodied. The detector side may be both the front of the detector facing the radiation to be recorded as well as the reverse of the detector averted from the radiation to be recorded.

The components of the element detecting radiation, the components of the analog-digital converter and the components of the connecting element are electrical or electronic components, in particular electrically conductive conductor paths, undoped and/or doped semiconductor layers. Any elements known from semiconductor technology can be employed for this purpose, provided that they can be used for the aforementioned components or additional components.

It is advantageous for the construction of CT detectors, if the sensor chip is provided with laterally adjacent, in particular structurally identical, sensor chips for a flat arrangement. The advantage is particularly great if the sensor chip can be arranged with additional sensor chips making optimum use of the space on four sides and these can be arranged on a flat plane or a cylindrical surface, as is usually customary in CT detectors. Crucial to the shape of the sensor chip is the element detecting radiation which should be a defined distance, ideally as short as possible, from each element detecting radiation of an adjacent sensor chip. To this end, the size and lateral condition of the sensor chip can be adjusted in four directions accordingly. Ideal shapes therefore appear to be prisms with a square base such as, for example, a cuboid shape.

Computerized tomography detectors with a multiplicity of sensor chips achieve a high resolution, even if each of the sensor chips only contributes one pixel to the medical image.

An embodiment of the invention is directed to a production method of a sensor chip including at least:

a first step where components of an element detecting radiation and components of an analog-digital converter are lithographically integrated on a detector side of a crystalline base plate, a second step where the detector side is insulated with the components of the element detecting radiation and the components of the analog-digital converter, a third step where a through-contact for the electrically conductive connection of conductor paths of the detector side is embodied with conductor paths of the second side of the crystalline base plate, and a fourth step where the second side of the crystalline base plate is insulated.

Finally, connection elements must still be applied on the second side as otherwise a connection to an analysis unit or computer would not be possible.

In production, it is important that the insulation of the detector side is removed from the base plate by the through-contact in a defined manner in order to be able to make the through-contact electroconductive. After the electrically conductive contact between the components on the detector side and the components on the second side has been achieved through the base plate, final insulation of the second side can take place.

An embodiment of the invention likewise comprises a method for the operation of a sensor chip in which radiation is detected on one detector side of a crystalline base plate of the sensor chip and the detected radiation is converted into an analog signal and the analog signal by way of an analog-digital converter into a digital signal.

As a result of the digital signal being conducted from the detector side through a through-contact of the base plate to a second side of the base plate, considerable wiring costs are saved. For CT detectors as well as for other detectors which employ a multiplicity of sensor chips, the savings result from a number of wires corresponding to the number of pixels no longer needing to be produced in the conventional manner. Instead, the necessary contacts can be realized with little expense by way of semiconductor technology.

Advantageously, the digital signal on the second side of the base plate can be conducted by electrical or electronic components. For this reason, the digital signal can still be processed on the second side of the base plate, for example, by additional components arranged there. Even if further processing is not to take place on the base plate, the digital signal can be advantageously diverted from the sensor chip via a connection element arranged on the second side of the base plate, without having to lead a cable around the sensor chip.

CT detectors, as used in X-ray computer tomographs, require a multiplicity of sensor elements which are arranged side by side on cylindrical or other surfaces in order to detect the X-rays directly or indirectly and convert them into a digital signal. Semiconductor technology is used for the production of these sensor elements. Two example embodiments of the sensor chip according to the invention are presented as sensor elements hereinafter by way of example.

FIG. 1 shows a sectional view of a first sensor chip in a production section before the through-contact. A detector side 12 of a base plate 1 with the components arranged there was already insulated. These components include a photodiode 9 and a section of an analog-digital converter 10, from which a conductor path 2 which is provided for a through-contact emerges. The conductor path 2 is on a side of a layer 8 facing the detector side 12 inside the sensor chip. When making the through-contact, the layer 8 on the conductor path 2 must be removed. A conductor path 14 and a component 3 likewise constitute parts of the analog-digital converter 10.

Figure 2:
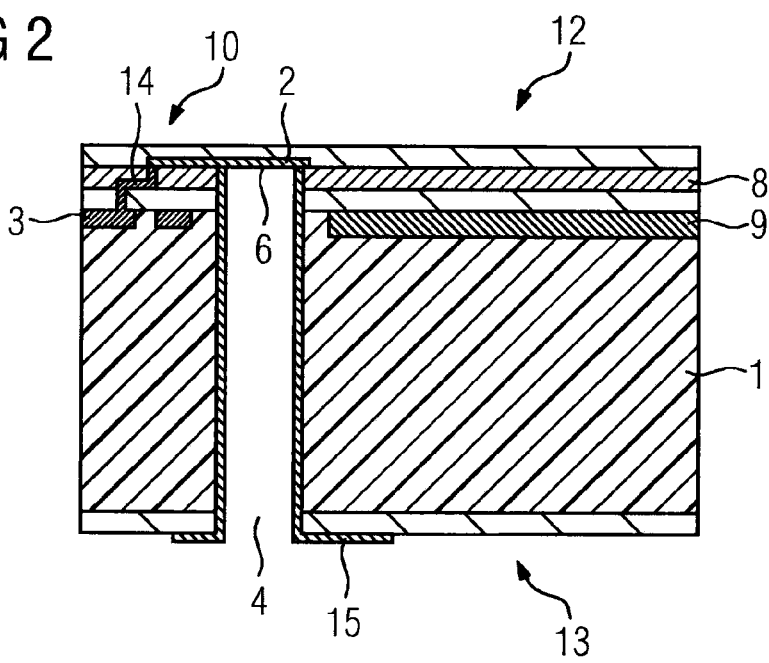

FIG. 2 shows the sensor chip from FIG. 1 after etching, insulation and metal plating. Now the analog-digital converter 10 can pass on a digital signal via the conductor path 2 via the through-contact 6, in other words, also via the metal plating 5 to a conductor path 15 of the opposite second side 13 of the base plate 1 for further use.

The electrical contact is realized by the additional underside application of the metallic through-contact 6 on the conductor path 2 which is only conductive if the material of the base plate 1, for example, silicon, was fully removed vertically by the etching process. In this case, the through-contact is also called "through Silicon via" (TSV). The signals which flow through TSV require a current of some 10 pA (picoampere).

After the through-contact the insulation of the second side 13 and the application of the solder balls 7 can take place. These solder balls 7 serve to transmit the digital signal to an insulated cable (not shown) and thus create an electrical connection to an analysis unit, for example, a computer.

The detector side 12 may be defined as the upper side because there the radiation 11 to be detected by a scintillation element (not shown) or by a radiation source of the tomograph impinges on the sensor chip. Consequently, the second side 13 may be called the underside.

Figure 3:
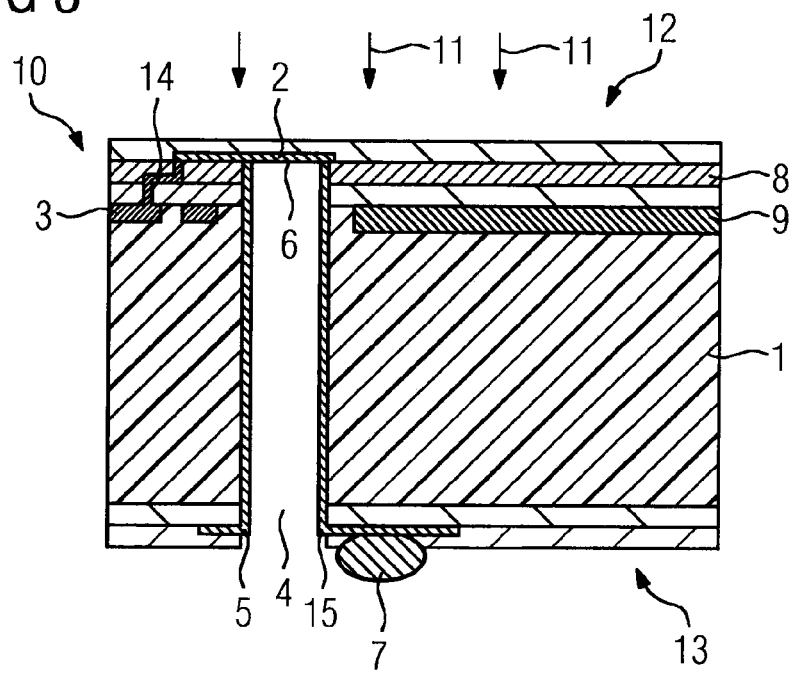

FIG. 3 shows a sectional view of the first sensor chip from FIG. 2 after the application of a connection element embodied as a solder ball 7.

An example embodiment of the first sensor chip of FIGS. 1 to 3 is advantageous in that the components, namely the photodiode 9 and the analog-digital converter 10 can be produced in a conventional CMOS process (CMOS=complementary metal-oxide semiconductor). The treatment of two base plates and their electrical connection is therefore completely unnecessary. The potential for savings is considerable. Apart from the reduction in production costs, the robustness, service life and reliability of the sensor chip are also improved.

A large part of the space-saving advantage arises as a result of the operating procedure of the first sensor chip of FIGS. 1 to 3 in particular as a result of digital-analog conversion taking place in the immediate vicinity of the element 9 detecting radiation, namely on the detector side 12 of the base plate 1. Distribution of the digital signal via the metal plating 5 of the through-contact 6 saves space as the detector side 12 need not be equipped with cable connections which would hinder radiation detection. Instead, the second side 13, which is averted from the radiation in any case, can be equipped with the connection elements 7 or additional components.

Furthermore, there are advantages compared with the transmission of analog signals through the through-contacts, for the analog signals react sensitively to leakage currents in the picoampere range. This is not the case with digital signals. Further robustness is achieved thereby.

Figure 4:
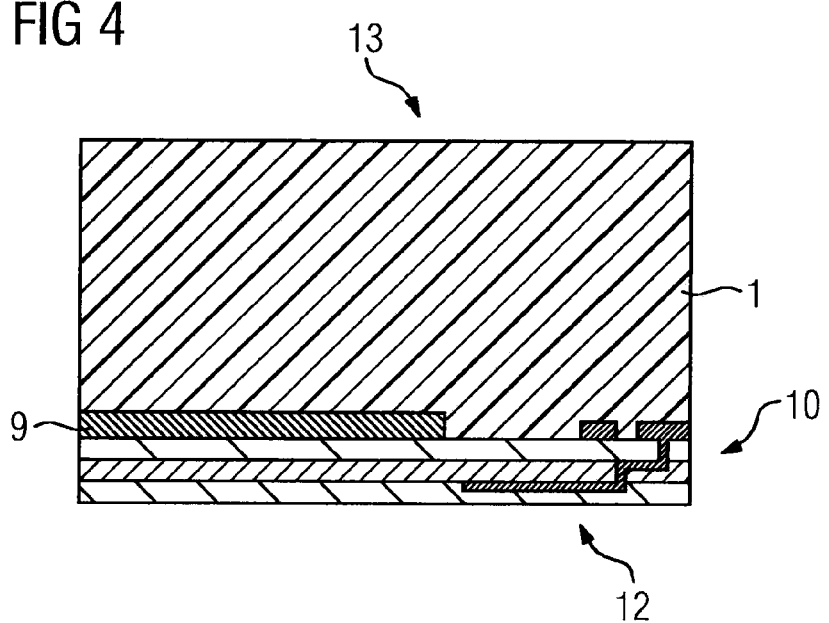
Figure 5:
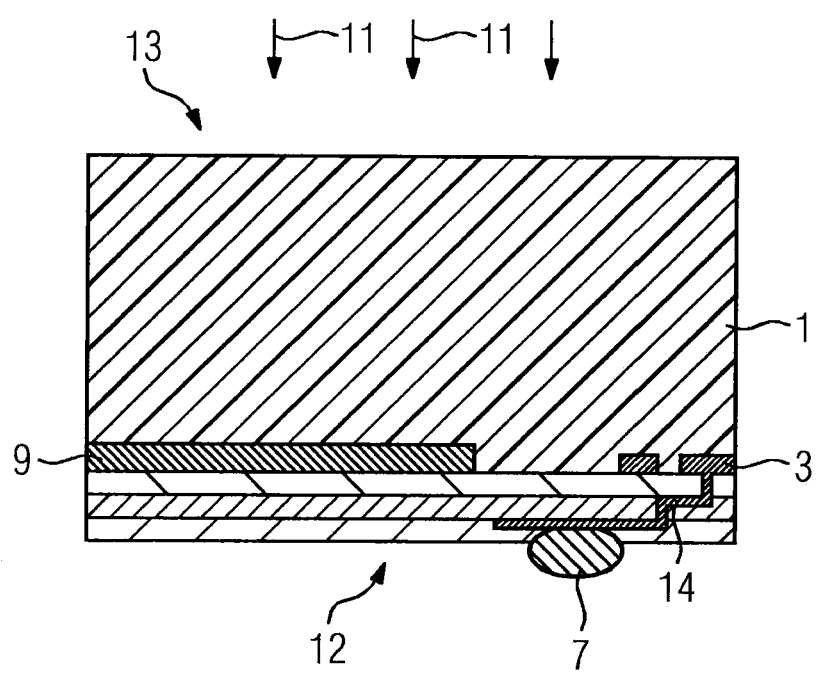

FIG. 4 shows a cutaway view of a second sensor chip with a radiation-transmissive base plate 1 in which—unlike the first sensor chip of FIGS. 1 to 3—all the components are arranged on the detector side 12.

A first advantage is that the photodiode 9 and the analog-digital converter 10 can be produced simultaneously in the same CMOS process.

A second advantage is that proximity of the analog-digital converter 10 to the element 9 detecting radiation can be achieved without the use of a through-contact. Instead the radiation is used for relatively unproblematic transmission through the base plate 1. This example embodiment is a particularly cost-efficient solution for this reason. It should only be ensured that the material of the base plate 1 is as radiation-transmissive as possible for the radiation 11 to be detected in order to achieve sufficient signal strength in the photodiode 9.

In summary, an embodiment of the invention relates to a sensor chip, in particular for computerized tomography detectors, having an analog-digital-converter 10 electrically connected to an element 9 detecting radiation. The problem addressed by the invention is that of defining a sensor chip which is as cost-efficient and reliable as possible. This is achieved by using one single crystalline base plate 1, on which all required components 7,9,10 of the sensor chip are applied, wherein a through-contact 6 between the conductor paths 14, 15 or the contacts of both sides of the base plate 1 is used as applicable in order to connect the components 7,9,10 of both sides 12, 13 to each other.

The invention claimed is:

1. A sensor chip, comprising:
an analog-digital-converter electrically connected to an element to detect radiation and a crystalline base plate, components of the element to detect radiation and components of the analog-digital-converter being lithographically integrated simultaneously via a single complementary metal-oxide semiconductor process on one detector side of the crystalline base plate.

2. The sensor chip of claim 1, wherein the analog-digital-converter is electrically connected to an electrical connecting element on a second side of the crystalline base plate, opposite the detector side of the crystalline base plate, via a through-contact of the crystalline base plate.

3. The sensor chip of claim 2, wherein the through-contact includes metal plating, provided for transmission of a digital signal from the detector side, through the crystalline base plate, to the second side of the crystalline base plate.

4. The sensor chip of claim 3, wherein the through-contact is formed at least partially by a recess in the crystalline base plate.

5. The sensor chip of claim 4, wherein the recess is an etched recess.

6. The sensor chip of claim 4, wherein the electrical connecting element is applied on the second side of the crystalline base plate.

7. The sensor chip of claim 2, wherein the crystalline base plate is permeable for the radiation detectable by the element to detect radiation and the electrical connecting element is applied on the detector side of the crystalline base plate.

8. The sensor chip of claim 2, wherein the components of the element to detect radiation, the components of the analog-digital-converter and the components of the connecting element are electrical or electronic components.

9. The sensor chip of claim 1, wherein the crystalline base plate is permeable for the radiation detectable by the element to detect radiation and the electrical connecting element is applied on the detector side of the crystalline base plate.

10. The sensor chip of claim 1, wherein the components of the element to detect radiation, the components of the analog-digital-converter and the components of the connecting element are electrical or electronic components.

11. The sensor chip of claim 10, wherein the components of the element to detect radiation, the components of the analog-digital-converter and the components of the connecting element are undoped and/or doped semiconductor layers.

12. The sensor chip of claim 1, wherein the sensor chip is intended for flat arrangement with laterally adjacent sensor chips.

13. A computerized tomography detector comprising:
a multiplicity of the sensor chips of claim 12.

14. The sensor chip of claim 12, wherein the sensor chip is intended for structurally identical sensor chips.

15. The sensor chip of claim 1, wherein the sensor chip is for a computerized tomography detector.

16. A computerized tomography detector comprising:
a multiplicity of the sensor chips of claim 1.

17. A production method of a sensor chip, comprising:
lithographically integrating simultaneously via a single complementary metal-oxide semiconductor process components of an element to detect radiation and components of an analog-digital-converter on one detector side of a crystalline base plate;
insulating the detector side with the components of the element to detect radiation and the components of the analog-digital-converter;
designing a through-contact, for the electrically conductive connection of conductor paths of the detector side, with conductor paths of the second side of the crystalline base plate; and
insulating the second side of the crystalline base plate.

18. A method for the operation of a sensor chip, the method comprising:
detecting radiation on one detector side of a crystalline base plate of the sensor chip;
converting the detected radiation into an analog signal;
converting the analog signal into a digital signal by way of an analog-digital converter lithographically integrated simultaneously with components of the detector via a single complementary metal-oxide semiconductor process on the one detector side of the crystalline base plate; and
conducting the digital signal from the detector side, via a through-contact of the base plate, to a second side of the base plate.

19. The method as claimed in claim 18, wherein the digital signal on the second side of the base plate is conducted by electrical or electronic components.

20. The method as claimed in claim 19, wherein the digital signal on the second side of the base plate is conducted by components of a connecting element.

* * * * *